(12) United States Patent
Hibino (10) Patent No.: US 6,496,405 B2
(45) Date of Patent: Dec. 17, 2002

(54) SEMICONDUCTOR MEMORY APPARATUS AND METHOD FOR OUTPUTTING DATA (75) Inventor: Kenji Hibino, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/835,609

(22) Filed: Apr. 10, 2001

(65) Prior Publication Data
US 2002/0005547 A1 Jan. 17, 2002

(30) Foreign Application Priority Data
Apr. 10, 2000 (JP) ........................................ 2000-108603

(51) Int. Cl.[7] .............................................. G11C 17/00
(52) U.S. Cl. ..................... 365/104; 365/63; 365/230.03
(58) Field of Search ........................... 365/103, 94, 63, 365/185.16, 185.25, 185.05, 185.21, 185.11, 230.03, 203, 210, 207, 230.08, 104, 51, 189.04

(56) References Cited
U.S. PATENT DOCUMENTS

| | | | | |
|---|---|---|---|---|
| 5,241,497 A | * | 8/1993 | Komarek | 365/185.16 |
| 5,268,861 A | | 12/1993 | Hotta | |
| 5,793,698 A | * | 8/1998 | Komarek et al. | 365/230.08 |
| 5,909,405 A | * | 6/1999 | Lee et al. | 365/230.03 |
| 6,088,277 A | * | 7/2000 | Kim et al. | 365/207 |
| 6,141,253 A | * | 10/2000 | Lin | 365/185.03 |

FOREIGN PATENT DOCUMENTS

| | | |
|---|---|---|
| JP | 04-311900 | 11/1992 |
| JP | 08-185694 | 7/1996 |
| JP | 09-091963 | 4/1997 |
| JP | 09-251788 | 9/1997 |

OTHER PUBLICATIONS

English Abstracts of JP 04–311900, 09–251788, 08–185694, 09–091963 (noted above).

* cited by examiner

Primary Examiner—David Nelms
Assistant Examiner—Gene N. Auduong
(74) Attorney, Agent, or Firm—Darryl G. Walker (57) ABSTRACT A semiconductor memory device (100) having an array of ROM cells (101) based on a flat cell architecture has been disclosed. Semiconductor memory device (100) can include a y-selector (103) coupled between a sense amplifier (102) and array (101). During a read operation, the y-selector can electrically connect a selected digit line (D2) and an adjacent digit line (D3) to the sense amplifier. Y-selector (103) can couple a next digit line (D4) to a precharge voltage that may be supplied by a precharge circuit (104). A virtual ground selector (105) can apply a ground voltage level from a main virtual ground line (VG1) to sources of a column of memory cells including a selected memory cell (310). Virtual ground selector (105) can apply a precharge voltage to an adjacent main virtual ground line (VG2). In this manner, a minimum sensing current, when a series of memory cells along a selected word line (W01) are on-bit cells, can be improved.

18 Claims, 12 Drawing Sheets

"H" INDICATES THAT A HIGH LOGIC LEVEL SIGNAL IS SUPPLIED TO SIGNAL LINE
BLANK INDICATES THAT A LOW LOGIC LEVEL SIGNAL IS SUPPLIED TO SIGNAL LINE

| Signal | D0 B0 | D0 B1 | D0 B2 | D0 B3 | D1 B4 | D1 B5 | D1 B6 | D1 B7 | D2 B0 | D2 B1 | D2 B2 | D2 B3 | D3 B4 | D3 B5 | D3 B6 | D3 B7 | D4 B0 | D4 B1 | D4 B2 | D4 B3 | D5 B4 | D5 B5 | D5 B6 | D5 B7 | D6 B0 | D6 B1 | D6 B2 | D6 B3 | D7 B4 | D7 B5 | D7 B6 | D7 B7 |
|---|---|---|---|---|---|---|---|---|---|---|---|---|---|---|---|---|---|---|---|---|---|---|---|---|---|---|---|---|---|---|---|---|
| Y01 | H | H | | | H | H | | | H | H | | | H | H | | | H | H | | | H | H | | | H | H | | | H | H | | |
| Y12 | | H | H | | | H | H | | | H | H | | | H | H | | | H | H | | | H | H | | | H | H | | | H | H | |
| Y23 | | | H | H | | | H | H | | | H | H | | | H | H | | | H | H | | | H | H | | | H | H | | | H | H |
| Y34 | H | | | H | H | | | H | H | | | H | H | | | H | H | | | H | H | | | H | H | | | H | H | | | H |
| Y45 | | | | | H | H | | | | | | | H | H | | | | | | | H | H | | | | | | | H | H | | |
| Y56 | | | | | | H | H | | | | | | | H | H | | | | | | | H | H | | | | | | | H | H | |
| Y67 | | | | | | | H | H | | | | | | | H | H | | | | | | | H | H | | | | | | | H | H |
| Y70 | | | | | H | | | H | | | | | H | | | H | | | | | H | | | H | | | | | H | | | H |
| P0 | H | | | | | | | | H | | | | | | | | H | | | | | | | | H | | | | | | | |
| P1 | | H | | | | | | | | H | | | | | | | | H | | | | | | | | H | | | | | | |
| P2 | | | H | | | | | | | | H | | | | | | | | H | | | | | | | | H | | | | | |
| P3 | | | | H | | | | | | | | H | | | | | | | | H | | | | | | | | H | | | | |
| P4 | | | | | H | | | | | | | | H | | | | | | | | H | | | | | | | | H | | | |
| P5 | | | | | | H | | | | | | | | H | | | | | | | | H | | | | | | | | H | | |
| P6 | | | | | | | H | | | | | | | | H | | | | | | | | H | | | | | | | | H | |
| P7 | | | | | | | | H | | | | | | | | H | | | | | | | | H | | | | | | | | H |
| BS0 | H | H | H | H | H | H | H | H | | | | | | | | | H | H | H | H | H | H | H | H | | | | | | | | |
| BS1 | | | | | | | | | H | H | H | H | H | H | H | H | | | | | | | | | H | H | H | H | H | H | H | H |
| GS0 | H | H | H | H | H | H | H | H | H | H | H | H | H | H | H | H | | | | | | | | | | | | | | | | |
| GS1 | | | | | | | | | | | | | | | | | H | H | H | H | H | H | H | H | | | | | | | | |
| GS2 | H | H | H | H | H | H | H | H | | | | | | | | | | | | | | | | | H | H | H | H | H | H | H | H |
| GS3 | | | | | | | | | | | | | | | | | | | | | | | | | H | H | H | H | H | H | H | H |

SELECTION DIGIT LINES

"H" INDICATES THAT A HIGH LOGIC LEVEL SIGNAL IS SUPPLIED TO SIGNAL LINE
BLANK INDICATES THAT A LOW LOGIC LEVEL SIGNAL IS SUPPLIED TO SIGNAL LINE

|  | \multicolumn{4}{c}{SELECTION DIGIT LINES} | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|---|
|  | \multicolumn{4}{c}{D0 BANK} | \multicolumn{4}{c}{D1 BANK} | \multicolumn{4}{c}{D2 BANK} | \multicolumn{4}{c}{D3 BANK} | \multicolumn{4}{c}{D4 BANK} | \multicolumn{4}{c}{D5 BANK} | \multicolumn{4}{c}{D6 BANK} | \multicolumn{4}{c}{D7 BANK} |
|  | 0 | 1 | 2 | 3 | 4 | 5 | 6 | 7 | 0 | 1 | 2 | 3 | 4 | 5 | 6 | 7 | 0 | 1 | 2 | 3 | 4 | 5 | 6 | 7 | 0 | 1 | 2 | 3 | 4 | 5 | 6 | 7 |
| Y0 | H | H | H | H |   |   |   |   |   |   |   |   |   |   |   |   |   |   |   |   |   |   |   |   |   |   |   |   |   |   |   |   |
| Y1 |   |   |   |   | H | H | H | H |   |   |   |   |   |   |   |   |   |   |   |   |   |   |   |   |   |   |   |   |   |   |   |   |
| Y2 |   |   |   |   |   |   |   |   | H | H | H | H |   |   |   |   |   |   |   |   |   |   |   |   |   |   |   |   |   |   |   |   |
| Y3 |   |   |   |   |   |   |   |   |   |   |   |   | H | H | H | H |   |   |   |   |   |   |   |   |   |   |   |   |   |   |   |   |
| Y4 |   |   |   |   |   |   |   |   |   |   |   |   |   |   |   |   | H | H | H | H |   |   |   |   |   |   |   |   |   |   |   |   |
| Y5 |   |   |   |   |   |   |   |   |   |   |   |   |   |   |   |   |   |   |   |   | H | H | H | H |   |   |   |   |   |   |   |   |
| Y6 |   |   |   |   |   |   |   |   |   |   |   |   |   |   |   |   |   |   |   |   |   |   |   |   | H | H | H | H |   |   |   |   |
| Y7 |   |   |   |   |   |   |   |   |   |   |   |   |   |   |   |   |   |   |   |   |   |   |   |   |   |   |   |   | H | H | H | H |
| P0 | H |   |   |   |   |   |   |   | H |   |   |   |   |   |   |   | H |   |   |   |   |   |   |   | H |   |   |   |   |   |   |   |
| P1 |   |   | H |   |   |   |   |   |   |   | H |   |   |   |   |   |   |   | H |   |   |   |   |   |   |   | H |   |   |   |   |   |
| P2 |   |   |   |   | H |   |   |   |   |   |   |   | H |   |   |   |   |   |   |   | H |   |   |   |   |   |   |   | H |   |   |   |
| P3 |   |   |   |   |   |   | H |   |   |   |   |   |   |   | H |   |   |   |   |   |   |   | H |   |   |   |   |   |   |   | H |   |
| P4 |   |   |   | H |   |   |   |   |   |   |   | H |   |   |   |   |   |   |   | H |   |   |   |   |   |   |   | H |   |   |   |   |
| P5 |   | H |   |   |   |   |   |   |   | H |   |   |   |   |   |   |   | H |   |   |   |   |   |   |   | H |   |   |   |   |   |   |
| P6 |   |   |   |   |   | H |   |   |   |   |   |   |   | H |   |   |   |   |   |   |   | H |   |   |   |   |   |   |   | H |   |   |
| P7 |   |   |   |   |   |   |   | H |   |   |   |   |   |   |   | H |   |   |   |   |   |   |   | H |   |   |   |   |   |   |   | H |
| BS0 | H | H |   |   | H | H |   |   | H | H |   |   | H | H |   |   | H | H |   |   | H | H |   |   | H | H |   |   | H | H |   |   |
| BS1 |   |   | H | H |   |   | H | H |   |   | H | H |   |   | H | H |   |   | H | H |   |   | H | H |   |   | H | H |   |   | H | H |
| GS0 | H |   | H |   | H |   | H |   | H |   | H |   | H |   | H |   | H |   | H |   | H |   | H |   | H |   | H |   | H |   | H |   |
| GS1 |   | H |   | H |   | H |   | H |   | H |   | H |   | H |   | H |   | H |   | H |   | H |   | H |   | H |   | H |   | H |   | H |
| GS2 | H | H | H | H |   |   |   |   | H | H | H | H |   |   |   |   | H | H | H | H |   |   |   |   | H | H | H | H |   |   |   |   |
| GS3 |   |   |   |   | H | H | H | H |   |   |   |   | H | H | H | H |   |   |   |   | H | H | H | H |   |   |   |   | H | H | H | H |

SEMICONDUCTOR MEMORY APPARATUS AND METHOD FOR OUTPUTTING DATA

TECHNICAL FIELD

The present invention relates generally to a semiconductor memory device and more particularly to a semiconductor memory device and a method of detecting cell current for outputting data during a read operation.

BACKGROUND OF THE INVENTION

In order to reduce the chip size of a read only memory (ROM), memory array architecture can be based on a flat cell. A flat cell may not have element isolation regions in the cell array. Thus, memory cells along a row can be connected in series.

Figure 7:
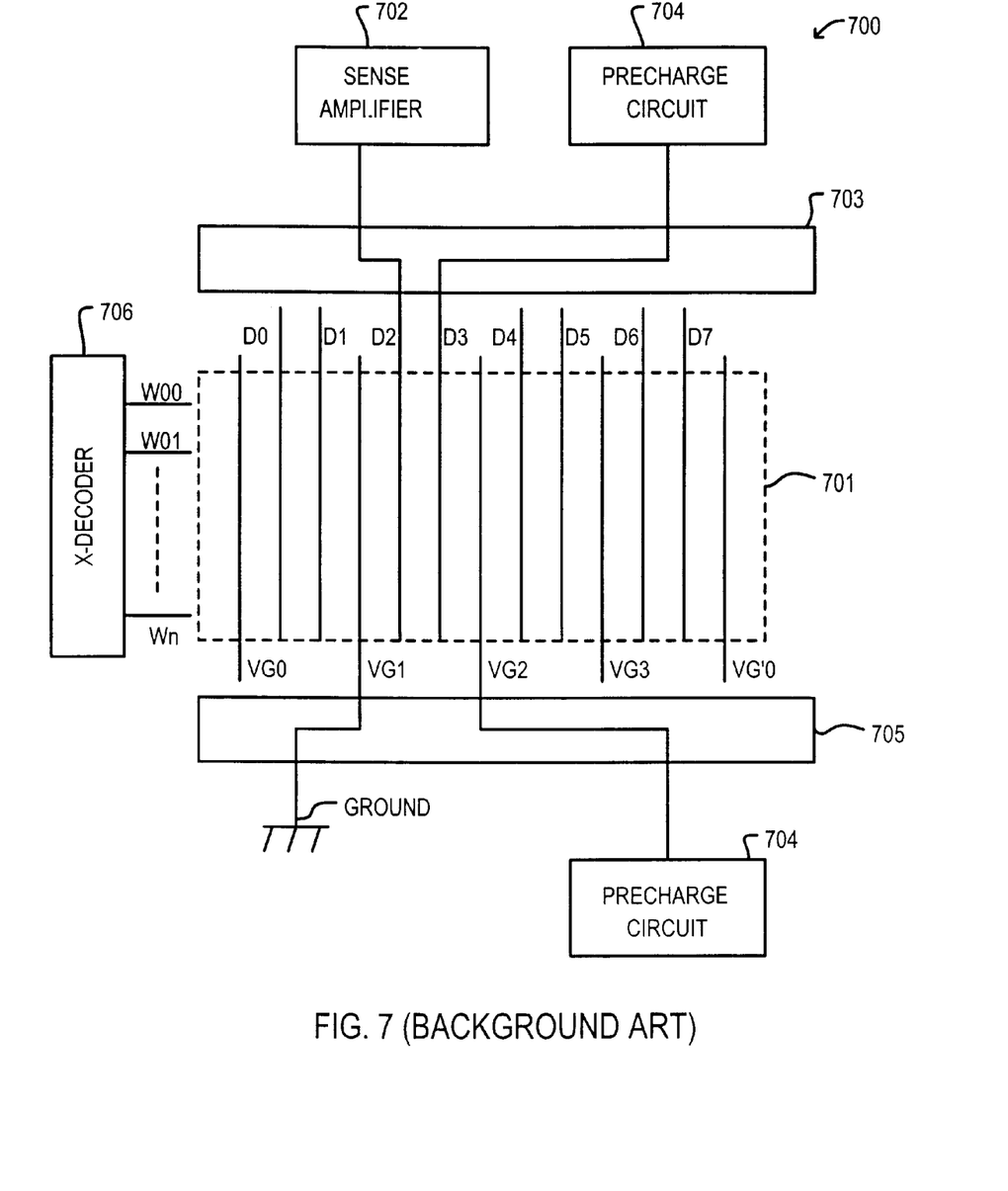
FIG. 7 is block schematic diagram of a conventional semiconductor memory device.

Referring now to FIG. 7, a conventional ROM having a cell array using a flat cell is set forth in a block schematic diagram and designated by the general reference character 700. Conventional ROM 700 includes a memory array 701, a sense amplifier 702, a y-selector 703, precharge circuits 704, a virtual ground (VG) selector 705, and a x-decoder 706.

The example illustrated in FIG. 7 is a read operation of a memory cell connected to digit line D2 and located between digit lines D2 and D1. In the read operation, based on an applied y-address, Y-selector 703 selectively connects a main digit line (in this example D2) to a sense amplifier 702 and selectively connects an adjacent main digit line (in this example D3) to precharge circuit 704. At this same time VG selector 705 connects virtual ground line VG1 to ground and virtual ground line VG2 to precharge circuit 704.

Figure 8:
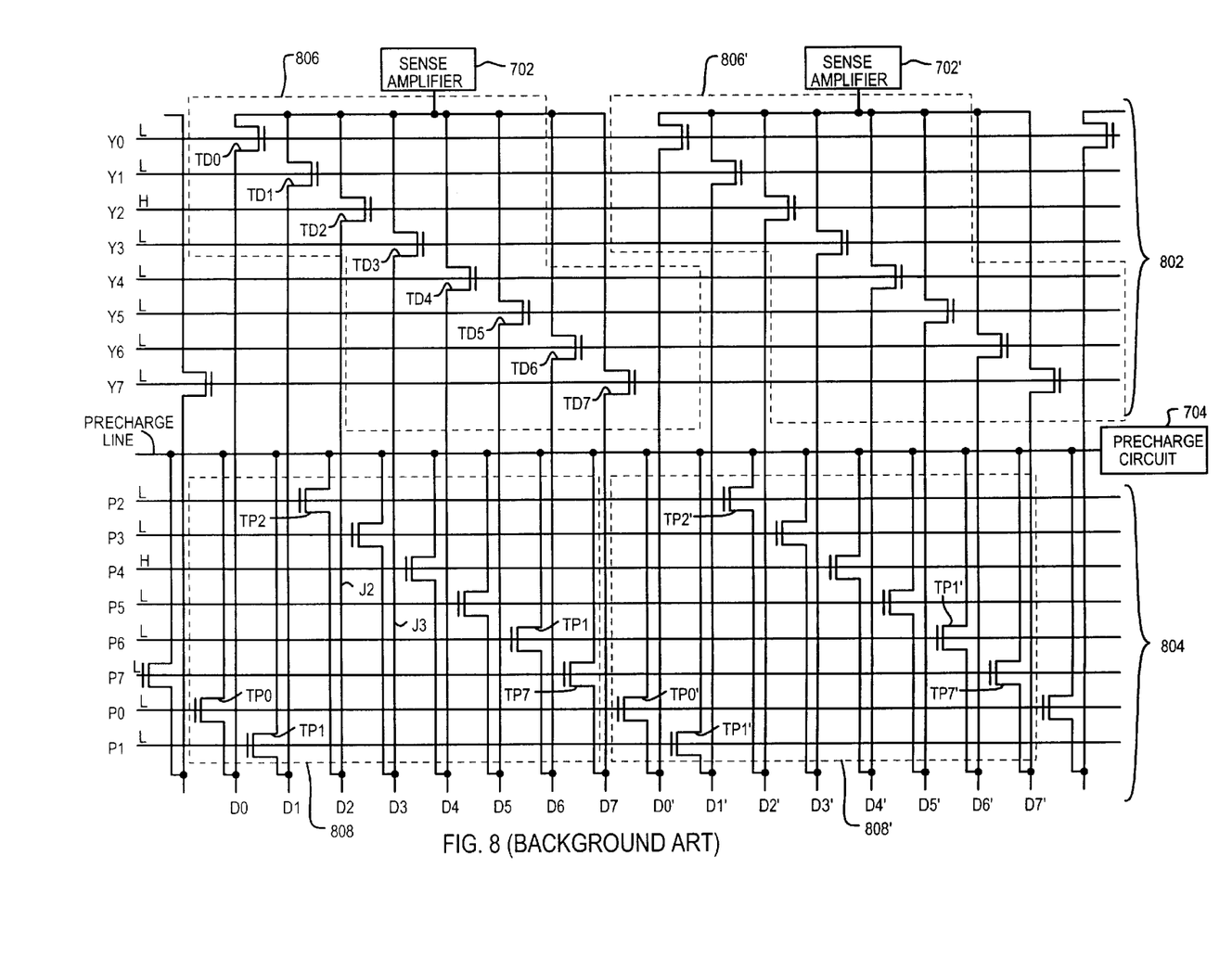
FIG. 8 is a circuit schematic diagram of the y-selector of the conventional semiconductor device in FIG. 8.

Referring now to FIG. 8, a circuit schematic wiring diagram of the y-selector 703 of FIG. 7 is set forth. Y-selector includes a data selection section 802 and a precharge section 804.

Data selection section 802 includes data selection circuits (806 and 806'). It is understood that there are many data selection circuits but only data selection circuits (806 and 806') are illustrated to avoid unduly cluttering the figure. Each data selection circuit operates in the same manner, thus only data selection circuit 806 will be discussed. Data selection circuit 806 receives y-selection signals (Y0 to Y7). Data selection circuit 806 includes data selection transistors (TD0 to TD7) connected between digit lines (D0 to D7) respectively and sense amplifer 702. Each data selection transistor (TD0 to TD7) receives a respective y-selection signal (Y0 to Y7) and selectively connects a digit line to a respective sense amplifier 702. In this case, y-selection signal Y2, is active (high), thus data selection transistor TD2 is conductive and electrically connects digit line D2 to sense amplifier 702. Thus, a data bit from a cell (not shown in FIG. 8) connected to digit line D2 is accessed. In this case, all other digit lines in the digit line group (D0, D1, and D3 to D7) are not connected to sense amplifier 702 because their corresponding data selection transistor (TD0, TD1, and TD3 to TD7) are turned off.

Precharge section 804 includes precharge selection circuits (808 and 808'). It is understood that there are many precharge selection circuits but only precharge selection circuits (808 and 808') are illustrated to avoid unduly cluttering the figure. Each precharge selection circuit operates in the same manner, thus only data selection circuit 808 will be discussed. Precharge selection circuit 808 receives precharge selection signals (P0 to P7). Precharge selection circuit 808 includes precharge selection transistors (TP0 to TP7) connected between digit lines (D0 to D7) respectively and precharge circuit 704. Each precharge selection transistor (TP0 to TP7) receives a respective precharge selection signal (P0 to P7) and selectively connects a digit line to precharge circuit 704. In this case, precharge selection signal P3, is active (high), thus precharge selection transistor TP3 is conductive and electrically connects digit line D3 to precharge circuit 704. Thus, digit line D3 is precharged when a data bit from a cell (not shown in FIG. 8) connected to adjacent digit line D2 is accessed. In this case, all other digit lines in the digit line group (D0, D1, D2 and D4 to D7) are not connected to precharge circuit 704 because their corresponding precharge selection transistor (TD0, TD1, TD2, and TD4 to TD7) are turned off.

Figure 9:
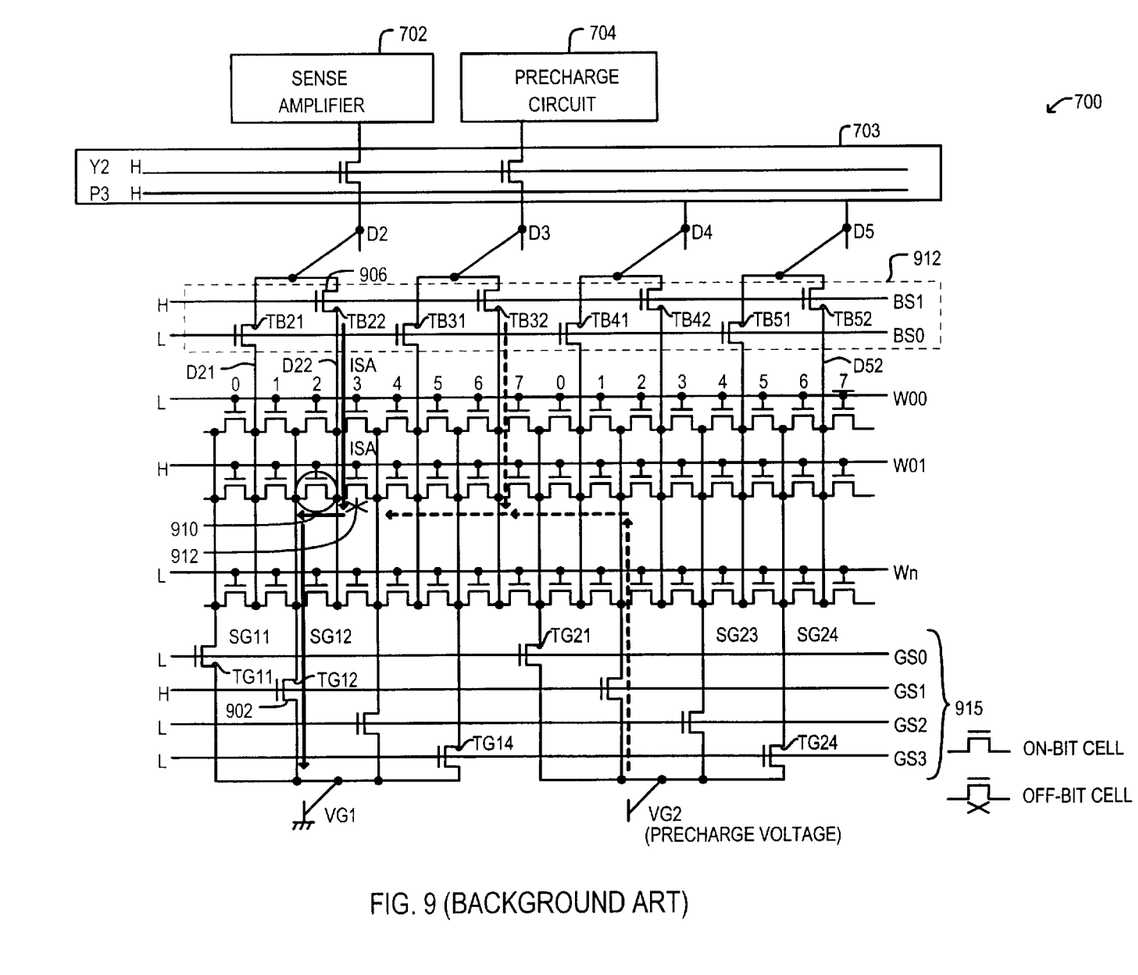
FIG. 9 is a circuit diagram showing an operating state of the conventional semiconductor memory device of FIG. 7.

Referring now to FIG. 9, a circuit diagram showing an operating state of conventional semiconductor memory device 700 is set forth. For simplicity, the circuit diagram of FIG. 9, illustrates only a portion of the memory cell array 702 corresponding to digit lines (D2 to D5)

The conventional semiconductor memory 700 of FIG. 9, illustrates a read from memory cell 910. Memory cell 910 has been programmed with a low threshold voltage, such that when word line W01 is high, memory cell 910 is conductive or is an on-bit cell. Memory cells that are not conductive (off-bit cell) when their respective word line is high are denoted with an "X". It can be seen that the memory cell adjacent to memory cell 910 and commonly connected to sub-digit line D22 is an off-bit cell.

Figure 10:
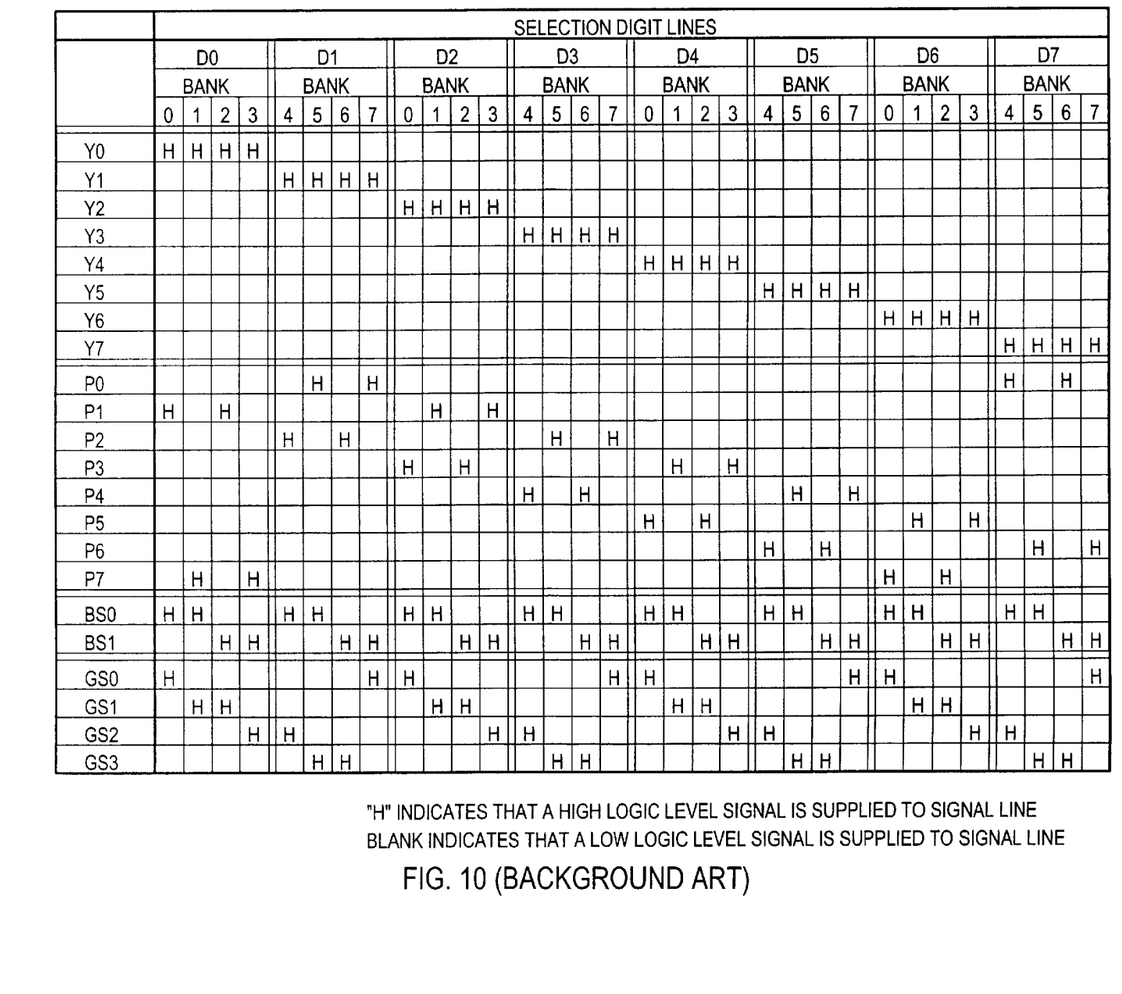
FIG. 10 is a truth table illustrating logic levels of selection signals of the conventional semiconductor memory device of FIG. 7.

FIG. 10 sets forth a truth table illustrating logic levels of y-selection signals (Y0 to Y7), precharge selection signals (P0 to P7), bank selection signals (BS0 and BS1) and ground selection lines (GS0 to GS3) when a predetermined memory cell column is selected. In the example illustrated in FIG. 9, memory cell 910 is selected. Memory cell 910 is in a memory cell column that corresponds with digit line D2 and BANK2. Thus, y-selection signal Y2, precharge signal P3, bank selection signal BS1, and ground selection line GS1 are all enabled (high).

When memory cell 910 is selected, word line W01 goes high and y-selection signal Y2, precharge signal P3, bank selection signal BS1, and ground selection line GS1 are all high. Also, main virtual ground line VG1 is connected to ground and main virtual ground line VG2 is connected to a precharge potential through precharge circuit 704. In this manner, selected memory cell 910 has a source electrically connected to ground through a VG selection transistor 902 and a drain electrically connected to sense amplifier 702 through bank selection transistor 906 and data selection transistor TD2.

In the case illustrated in FIG. 9, the cell adjacent to memory cell 910 is an off-cell, thus current flowing from precharge circuit 704 through the row of memory cells connected to word line W01 is blocked from sub-digit line D22 and memory cell 910. Therefore, in this case, a steady-state current ISA flowing through selected cell 910 is the same as the current flowing through digit line D2 and sensed by sense amplifier 702.

Figure 11:
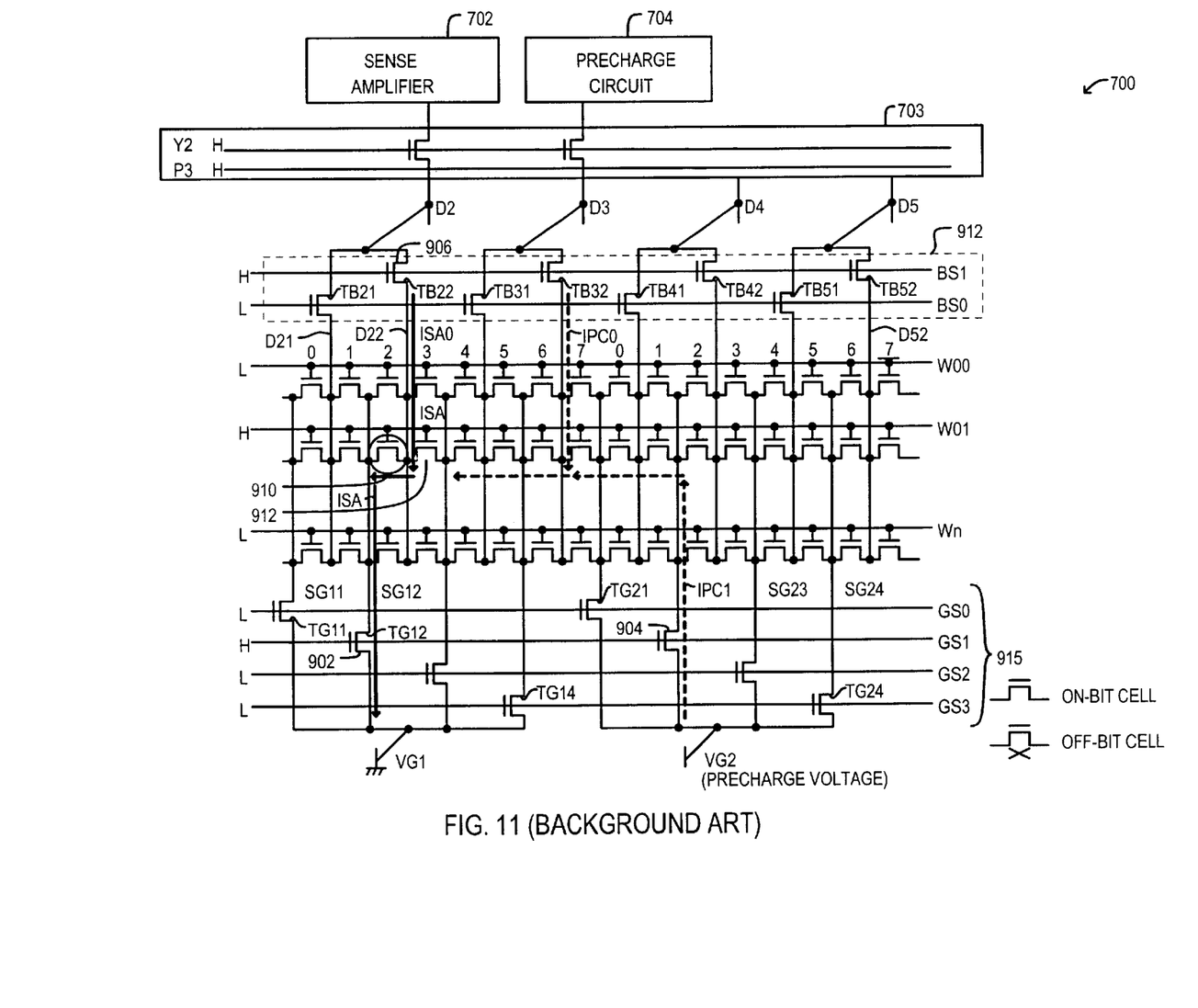
FIG. 11 is a circuit diagram showing an operating state of the conventional semiconductor memory device of FIG. 7.

Referring now to FIG. 11, a circuit diagram showing an operating state of conventional semiconductor memory device 700 is set forth. The circuit diagram of FIG. 11, illustrates a case where the memory cell adjacent to selected memory cell 910 is an on-bit cell. In this case, selected memory cell 910 provides a current path from ground to sense amplifier 702, shown as ISA. However, selected memory cell 910 also provides current paths from ground to precharge circuit 704. These undesirable current paths are illustrated by dashed lines, where IPC0 is a current path to precharge circuit 704 through digit line D3 and IPC1 is a current path to precharge circuit 704 through VG selection transistor 904. In this case, the current flowing through selected cell 910 is given by the sum of current ISA0 flowing through selected digit line D2 and the currents IPC0 and IPC1 flowing from precharge circuit 704.

$$ISA=ISA0+IPC0+IPC1$$

Figure 12:
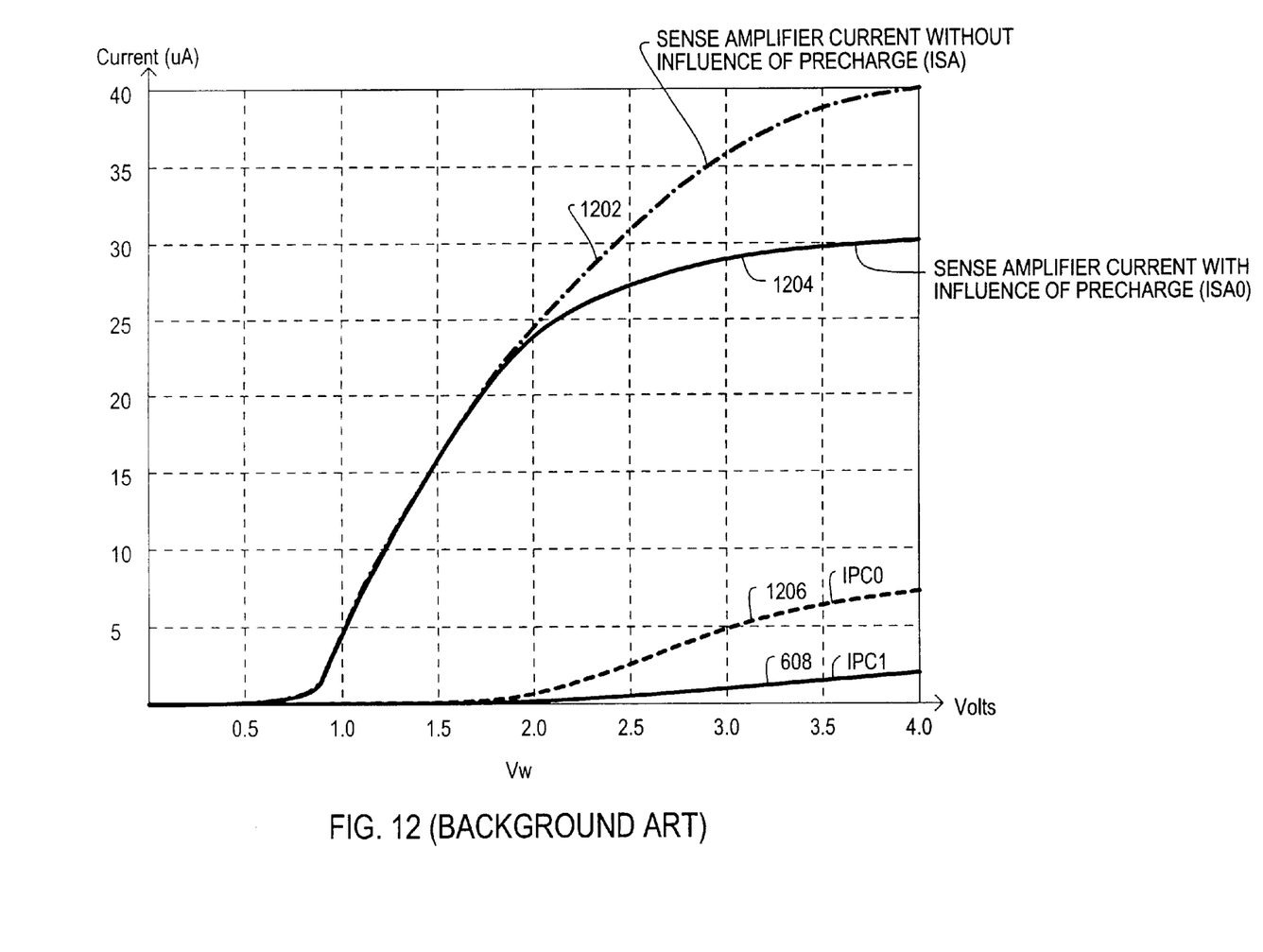
FIG. 12 is a graph illustrating a simulation of currents in the memory cell configurations of the conventional semiconductor memory devices FIG. 9 and FIG. 11 over a range of operating voltages.

Referring now to FIG. 12, a graph is shown illustrating a simulation of currents in the memory cell configurations of FIGS. 9 and 11 over a range of operating voltages.

Figure 1:
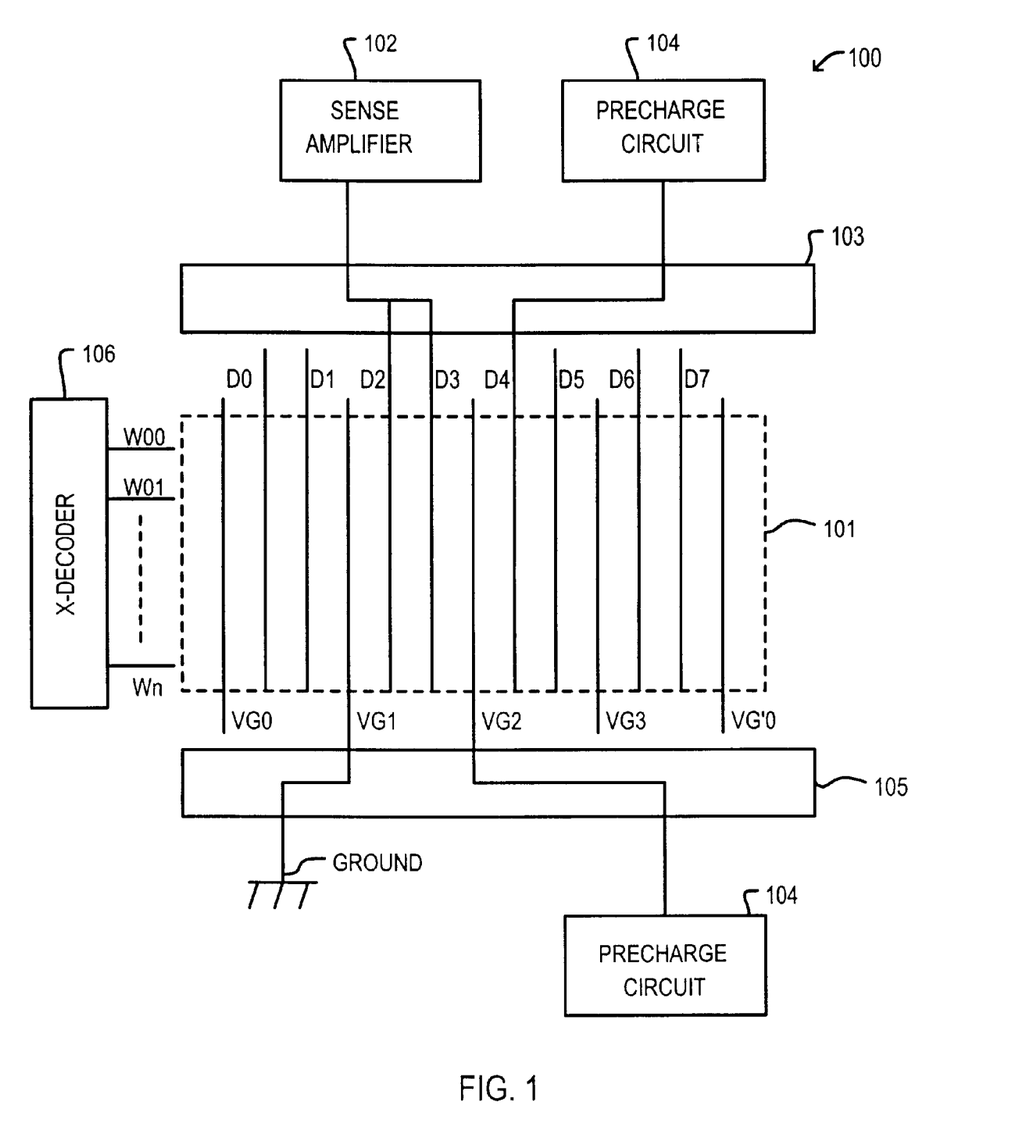
FIG. 1 is a block schematic diagram of a semiconductor memory device according to one embodiment.

Waveform 1202 illustrates the current ISA as shown in FIG. 9 in which the cell adjacent to selected cell 910 is an off-bit cell. Waveform 1204 illustrates the current ISA0 as shown in FIG. 11 in which the cell adjacent to selected cell 910 is an on-bit cell. Waveform 1206 illustrates the current IPC0 as shown in FIG. 11. Waveform 1208 illustrates the current IPC1 as shown in FIG. 1.

The simulation results indicate that there is a difference of more than 7 microamperes (uA) or approximately 18% between waveforms 1202 (ideal case, FIG. 9) and 1204 (FIG. 11 case) at an operating voltage of 3.3 volts. It can also be seen that the minimum value of the sense amplifier current is less than 30 uA at 3.3 volts in the case of the configuration of FIG. 11.

A technique for improving the precision of the current detection by stabilizing the sense amplifier current has been disclosed in Japanese Patent Application Laid Open No. Hei 4-311900. However, when the fluctuation in the sense amplifier current is large, the circuit design can be difficult and highly restricted. Also, if the minimum sense amplifier current decreases, noise tends to introduce erroneous operation.

In view of the above discussion, it would be desirable to provide a semiconductor memory in which the minimum sense amplifier current is increased as compared to conventional approaches. Still further it would also be desirable to decrease the difference between the current flowing through the selected memory cell and the current detected by the sense amplifier.

SUMMARY OF THE INVENTION

According to the present embodiments, a semiconductor memory device includes a selection circuit electrically connecting a first and second digit line to a sense amplifier during a read operation and the sense amplifier can detect a data value stored in a selected memory cell by in accordance with the summation of currents on the first and second digit lines.

According to one aspect of the embodiments, the semiconductor memory device can include a plurality of memory cells having source/drain paths arranged in series where adjacent memory cell are electrically connected at a common source/drain node.

According to another aspect of the embodiments, the semiconductor memory device can include a plurality of word lines arranged in a first direction and the plurality of memory cells can be electrically connected to a word line.

According to another aspect of the embodiments, the semiconductor memory device can include a third digit line being electrically connected to a precharge circuit.

According to another aspect of the embodiments, the semiconductor memory device can include a first virtual ground line receiving a reference voltage and selectively coupled to a source of the selected memory cell during a read operation.

According to another aspect of the embodiments, the semiconductor memory device can include a second virtual ground line receiving a precharge voltage and being selectively coupled to a source/drain connection of unselected ones of the plurality of memory cells.

According to another aspect of the embodiments, a selection circuit can receive selection signals and selectively electrically connect a virtual ground line to source/drain connection of memory cells.

According to another aspect of the embodiments, a selection circuit can receive selection signals and selectively electrically connect digit lines to a sense amplifier.

According to another aspect of the embodiments, a selection circuit can receive selection signals and selectively electrically connect a digit line to a precharge circuit.

According to another aspect of the embodiments, memory cells can be chain linked in series and can be programmed to conduct simultaneously when selected. A predetermined selected memory cell can have a cell current that includes the summation of a first current flowing through a first digit line, a second current flowing through a second digit line and a third current flowing from a precharge voltage supplied by at least one of the plurality of virtual ground lines and the first and second currents can be greater than the third current.

According to another aspect of the embodiments, the predetermined selected memory cell current can include a fourth current flowing from a precharge circuit through a digit line and the first and second currents can be greater than the fourth current.

According to another aspect of the embodiments, a plurality of sub-digit lines can be coupled to a digit line through a bank selector circuit. The bank selector circuit can receive a bank selection signal to selectively electrically connect a sub-digit line to a digit line.

According to another aspect of the embodiments, a method of outputting data includes detecting a data value stored in a selected memory cell by summing a first current flowing through a first digit line and a second current flowing through a second digit line.

According to another aspect of the embodiments, a cell current can include a summation of the first current flowing through a first digit line, the second current flowing through a second digit line, a third current flowing from a precharge voltage through a virtual ground line, and a fourth current flowing through a fourth digit line.

DETAILED DESCRIPTION OF THE EMBODIMENTS

Various embodiments of the present invention will now be described in detail with reference to a number of drawings.

Referring now to FIG. 1, a semiconductor memory device according to one embodiment is set forth in a block schematic diagram and designated by the general reference character 100. Semiconductor memory device 100 can be a ROM incorporating a flat cell array architecture. Semiconductor memory device 100 can include a memory array 101, a sense amplifier 102, a y-selector 103, precharge circuits 104, a virtual ground (VG) selector 105, and a x-decoder 106.

The semiconductor memory device 100 illustrated in FIG. 1 is configured to be in a read operation of a memory cell connected to digit line D2 and located between digit lines D2 and D1. In the read operation, based on an applied y-address, Y-selector 103 can selectively connect two main digit lines (in this example D2 and D3) to a sense amplifier 102 and can selectively connect an adjacent main digit line (in this example D4) to precharge circuit 104. At this same time VG selector 105 can connect virtual ground line VG1 to ground and virtual ground line VG2 to precharge circuit 104. It is understood that precharge circuit 104 can be the same precharge circuit or can be separate precharge circuits located in different areas of semiconductor memory device 100.

Sense amplifier 102 can sense the logic level of data stored in a selected memory cell by detecting the amount of current flowing through the selected memory cell. Sense amplifier 102 can serve to externally output data in a read cycle. In the read operation illustrated in FIG. 1, sense amplifier can be electrically connected to digit lines D2 and D3. Precharge circuit 104 can provide a precharge voltage that may be identical to the voltage supplied by sense amplifier 103 to selected main digit line D2. Precharge circuit 104 can provide the precharge voltage to an unselected main digit line D4. Precharge circuit 104 may also provide the precharge voltage to virtual ground line VG2.

Figure 2:
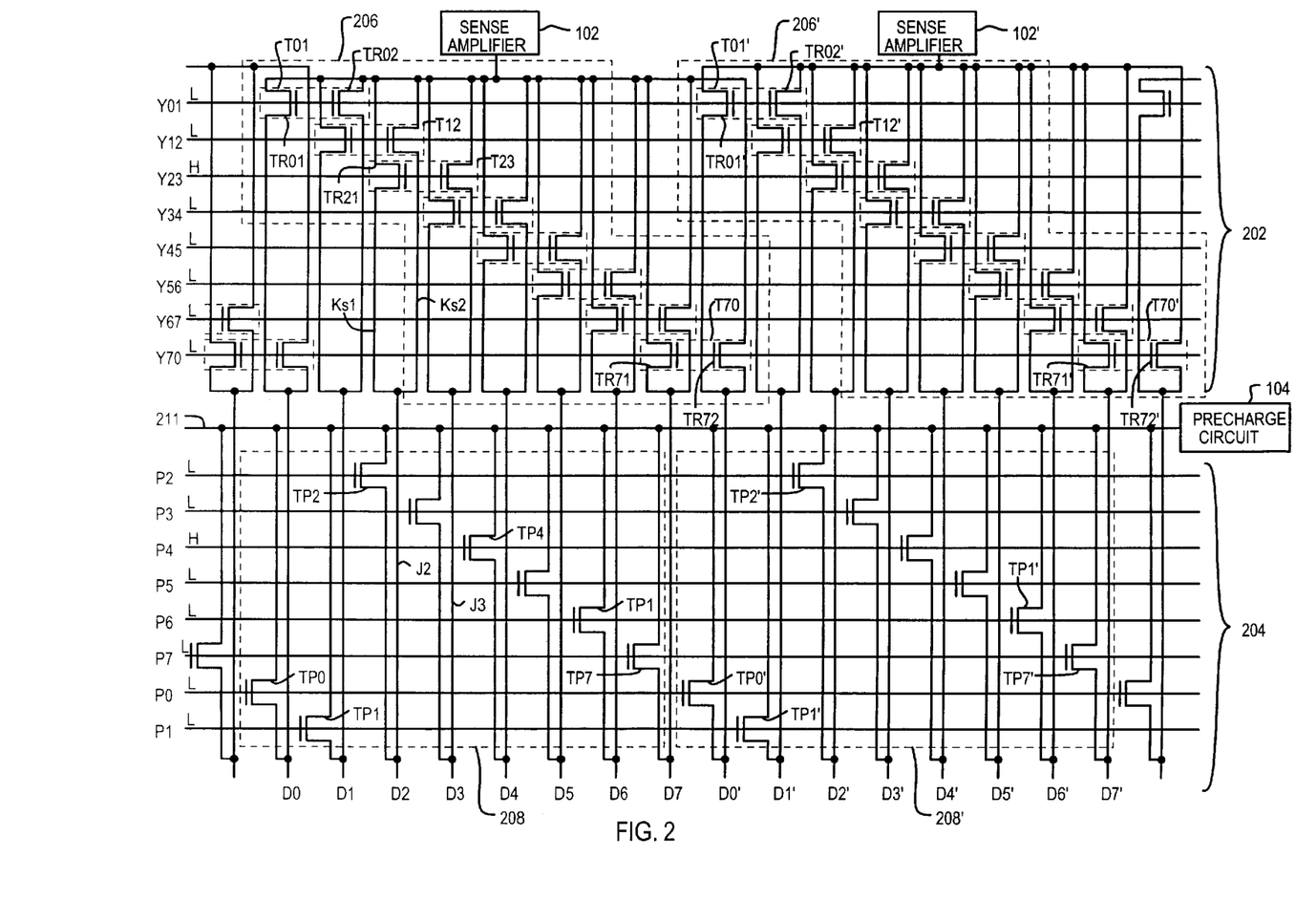
FIG. 2 is a circuit schematic wiring diagram of the y-selector of the embodiment in FIG. 1.

Referring now to FIG. 2, a circuit schematic wiring diagram of the y-selector 103 of FIG. 1 is set forth. Y-selector can include a data selection section 202 and a precharge section 204.

Data selection section 202 can include data selection circuits (206 and 206'). It is understood that there can be many data selection circuits but only data selection circuits (206 and 206') are illustrated to avoid unduly cluttering the figure. Each data selection circuit can operate in the same manner, thus only data selection circuit 206 will be discussed. Data selection circuit 206 can receive y-selection signals (Y01 to Y70). Data selection circuit 206 can include transfer circuits (T01 to T70). Transfer circuits (T01 to T07) can be electrically connected between digit lines (D0 to D7) and sense amplifer 102. Each transfer circuit can include a pair of transfer transistors (TR01 to TR72). Transfer transistors (TR01 to TR72) can each have a source-drain path coupled between a digit line (D0 to D7) and sense amplifier 102. Transfer transistors (TR01 to TR72) may be n-channel metal oxide semiconductor field effect transistors (MOSFETs).

Each transfer circuit (T01 to T70) can receive a respective y-selection signal (Y01 to Y70) and can selectively connect a pair of digit lines to a respective sense amplifier 102. In the read case illustrated in FIG. 2, y-selection signal Y23, can be active (high), thus transfer circuit T23 can be selected and can electrically connect digit lines D2 and D3 to sense amplifier 102. Thus, a data bit from a cell (not shown in FIG. 8) connected to digit line D2 can be accessed. In this case, all other digit lines in the digit line group (D0, D1, and D4 to D7) may not be connected to sense amplifier 102 because their corresponding transfer circuits (T01, T12, and T34 to T70) may be unselected.

Precharge section 204 can include precharge selection circuits (208 and 208'). It is understood that there can be many precharge selection circuits but only precharge selection circuits (208 and 208') are illustrated to avoid unduly cluttering the figure. Each precharge selection circuit can operate in the same manner, thus only precharge selection circuit 208 will be discussed. Precharge selection circuit 208 can receive precharge selection signals (P0 to P7). Precharge selection circuit 208 can include precharge selection transistors (TP0 to TP7). Precharge selection transistors can have a source drain path coupled between digit lines (D0 to D7) respectively and a precharge line 211. Precharge line 211 can provide the precharge voltage from precharge circuit 104. Precharge transistors (P0 to P7) may be nchannel MOSFETs. Each precharge selection transistor (TP0 to TP7) can receive a respective precharge selection signal (P0 to P7) and can selectively connect a digit line to precharge line 211. In this case, precharge selection signal P4, can be active (high), thus precharge selection transistor TP4 can be selected and may electrically connect digit line D4 to precharge line 211. Thus, digit line D4 can be precharged when a data bit from a cell (not shown in FIG. 2) coupled to adjacent digit line D2 is accessed. In this case, all other digit lines in the digit line group (D0 to D3 and D5 to D7) may not be connected to precharge line 211 because their corresponding precharge selection transistor (TD0 to TD3, and TD5 to TD7) may be unselected.

FIG. 2 can illustrate the physical wiring layout of y-selector 103. Y-selection signals (Y01 to Y70) and precharge selection signals (P0 to P7) can propagate along metal signal conductors disposed in the x-direction. The x-direction may be the direction in which the word lines in memory cell array 101 are disposed.

Referring to FIG. 2, it can be seen that digit lines (D0 to D7) can be disposed in the y-direction. Each digit line can provide first and second signal lines to first and second transfer circuits (T01 to T70) in data selection circuit 206. For example, digit line D2 can be shown as signal line J2 provided in the y-direction bypassing precharge selection circuit 208 and branching to provide first and second signal lines (Ks1 and Ks2) to first and second transfer circuits (T23 and T12), respectively. First and second signal lines (Ks1 and Ks2) can have a transfer transistor (TR21 and TR12), respectively, including source-drain paths allowing a selective electrical connection to sense amplifier 102.

Precharge line 211 can be a metal conductor disposed in the x-direction and may provide the precharge voltage to a plurality of precharge selection circuits (208 and 208')

It is noted that in the conventional y-selector 703 of FIG. 8, during a read, only one digit line (D0 to D7) is connected to sense amplifier 702, however, in the embodiment illustrated in FIG. 2, two digit lines (D0 to D7) can be electrically connected to sense amplifier 102.

Figure 3:
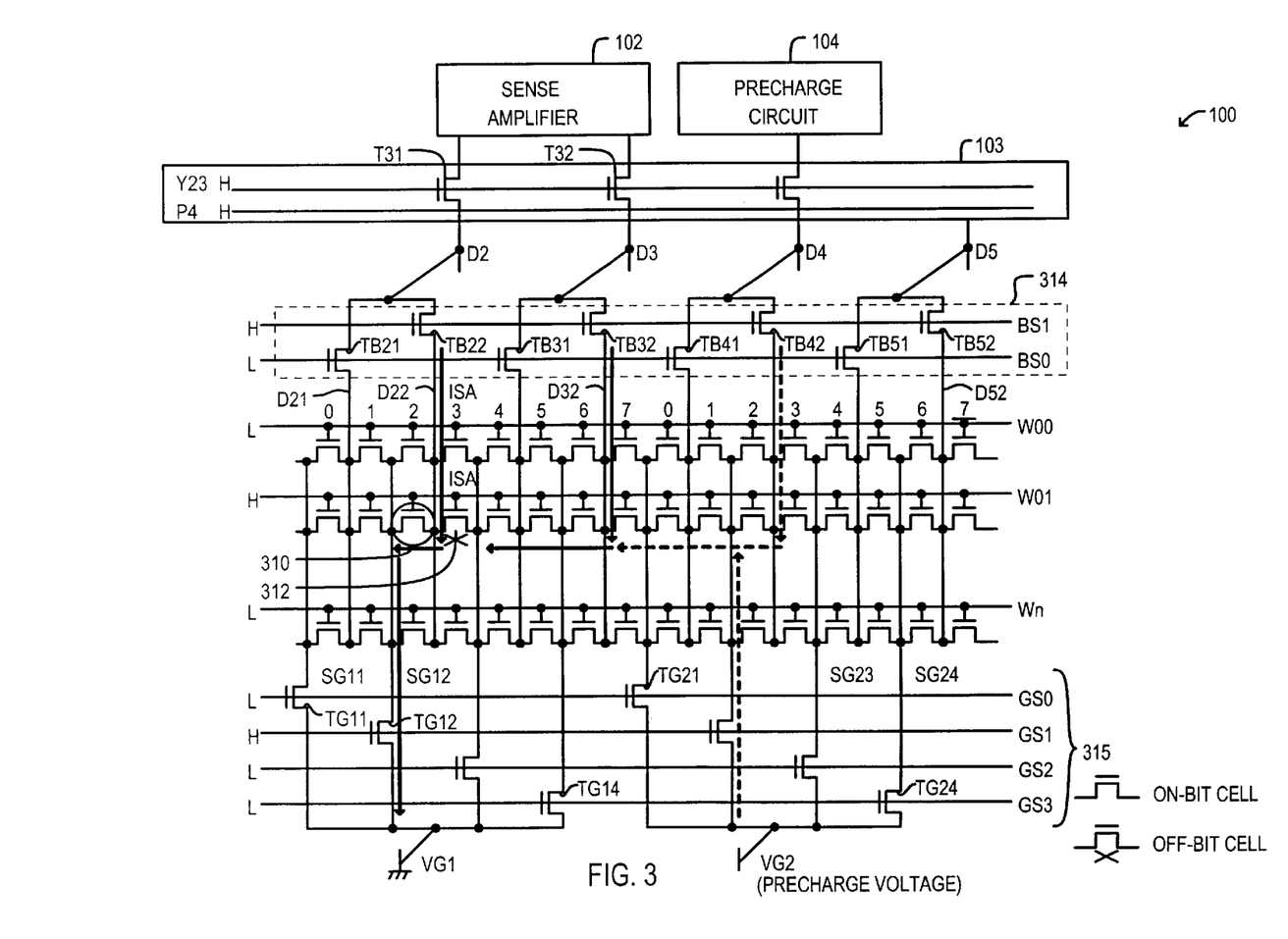
FIG. 3 is a circuit diagram showing an operating state of the semiconductor memory device according to the embodiment of FIG. 1.

Referring now to FIG. 3, a circuit diagram showing an operating state of semiconductor memory device 100 is set forth. For simplicity, the circuit diagram of FIG. 3, illustrates only a portion of the memory cell array 102 corresponding to digit lines (D2 to D5).

Semiconductor memory device 100 can include an array of memory cells. The semiconductor memory device 100 of FIG. 3, can illustrate a read from memory cell 310. Memory cell 310 can be located along word line W01, sub-digit line D22. Memory cell 310 has been programmed with a low threshold voltage, such that when word line W01 is high, memory cell 310 can be conductive or considered an on-bit cell. Memory cells that are not conductive (off-bit cell) when their respective word line is high are denoted with an "X". It can be seen that the memory cell 312 adjacent to memory cell 310 and commonly connected to sub-digit line D22, is an off-bit cell. Memory cells can be programmed during the manufacturing of the semiconductor memory device 100 by controlling a threshold voltage of the memory cell transistor with an ion injection step, as but one example.

Semiconductor memory device 100 of FIG. 3 can include a bank selection circuit 412. Bank selection circuit 412 can include bank selection transistors with TB21 to TB52 illustrated in FIG. 3. Although only bank selection transistors TB21 to TB52 are illustrated in FIG. 3, it is understood that there can be two bank selection transistors for each digit line in semiconductor memory device 100. Bank selection transistors TB21 to TB52 can have source drain paths between a digit line (D2 to D5) and a sub-digit line (D21 to D52) and can each receive a bank selection line (BS0 or BS1) at a control terminal. Each digit line (D0 to D7) can be electrically connected to one of two sub-digit line pairs in accordance with the value of bank selection lines BS0 and BS1. As an example, digit line D2 can be electrically connected to sub-digit line D21 if bank selection line BS0 is at a high logic level. Alternatively, digit line D2 can be electrically connected to sub-digit line D22 if bank selection line BS1 is at a high logic level. Bank selection lines (BS0 and BS1) may be controlled by a bank selection decoder (not shown) in a manner such that only one bank selection line (BS0 or BS1) may be at a high logic level at a predetermined time. While the other bank selection line (BS0 or BS1) may be at a low logic level.

Word lines (W00 to Wn) can be controlled by x-decoder 106 in such a manner that only one word line may be selected during a read operation. In this manner, one word line (W02 in the example illustrated in FIG. 3) can be at a high logic level while all other word lines in memory cell array 101 can be at a low logic level.

Referring once again to FIG. 3, a semiconductor memory device 100 can include virtual ground selection circuit 315. Virtual round selection circuit 315 can be coupled between memory cells and main virtual ground lines (VG1 and VG2). Although only two virtual ground lines (VG1 and VG2) are illustrated, it us understood that there can be many virtual ground lines and associated virtual ground selection circuitry in the semiconductor memory device 100. Virtual ground selection circuit 315 can receive ground selection lines (GS0 to GS3) and selectively couple a source/drain of a selected column of memory cells to ground based on the logic value of ground selection lines (GS0 to GS3). Ground selection circuit 315 can include ground selection transistors (TG11 to TG14 and TG21 to TG24). Ground selection transistors (TG11 to TG14 and TG21 to TG24) can have a source drain path connected between a virtual ground line (VG1 and VG2) and a common source drain connection of two adjacent column of memory cells by way of secondary ground lines (SG11 to SG24). Ground selection lines (GS0 to GS3) can be disposed in the x-direction and secondary ground lines (SG01 to SG24) can be disposed in the y-direction.

Virtual ground selection circuit 315 can operate in such a manner that only one of the four secondary ground lines (SG11 to SG14) can be electrically connected to ground during a read operation when a memory cell connected to one of the four secondary ground lines (SG11 to SG14) is selected. In other words, only one of ground selection lines (GS0 to GS3) can be activated (logic high) during a read operation.

Figure 4:
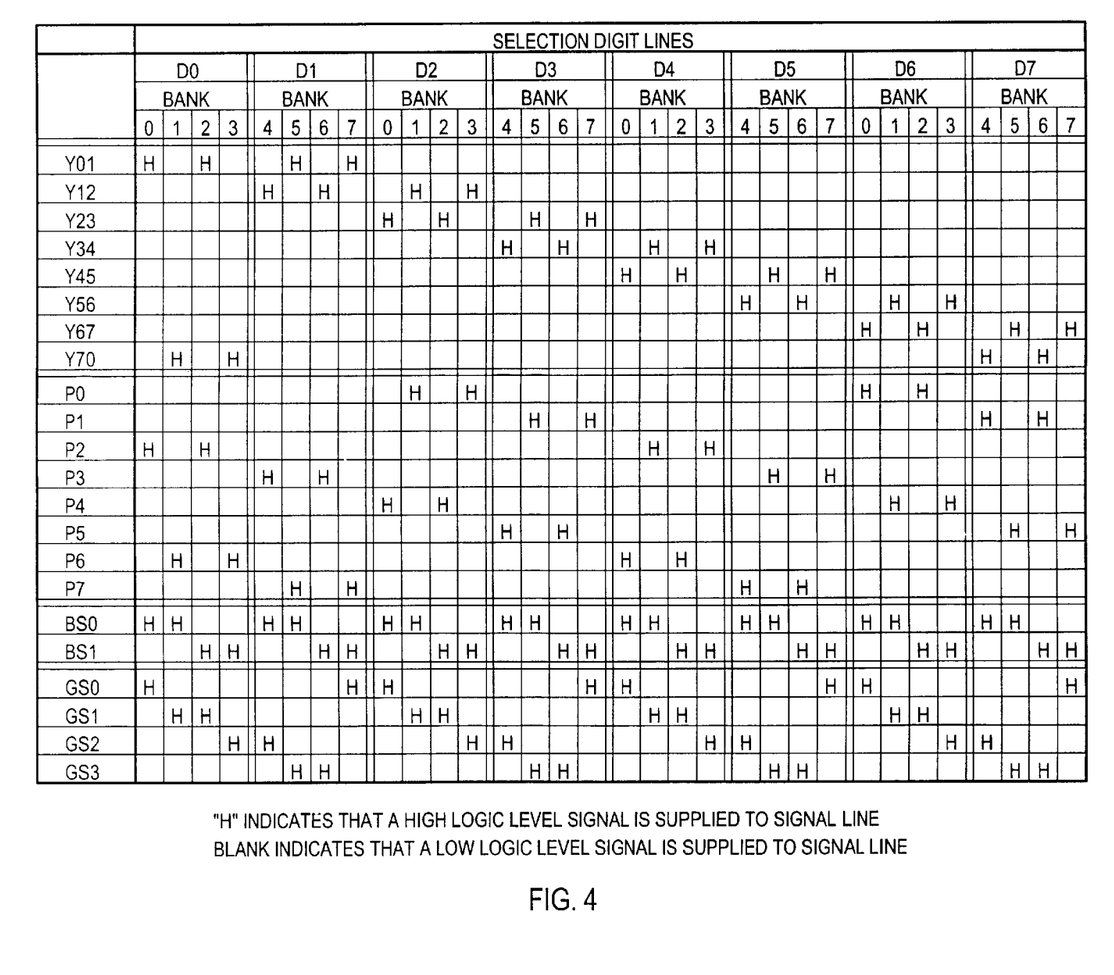
FIG. 4 is a truth table illustrating logic levels of selection signals of a semiconductor memory device according to one embodiment when a predetermined memory cell column is selected.

FIG. 4 sets forth a truth table illustrating logic levels of y-selection signals (Y01 to Y70), precharge selection signals (P0 to P7), bank selection signals (BS0 and BS1) and ground selection lines (GS0 to GS3) when a predetermined memory cell column is selected. In the example illustrated in FIG. 3, memory cell 310 can be selected. Memory cell 310 is in a memory cell column that corresponds with digit line D2 and BANK2. Thus, y-selection signal Y23, precharge signal P4, bank selection signal BS1, and ground selection line GS1 can all be enabled (logic high).

When memory cell 310 is selected, word line W01 can become logic high and y-selection signal Y23, precharge signal P4, bank selection signal BS1, and ground selection line GS1 can also become logic high. Also, main virtual ground line VG1 can be connected to ground and main virtual ground line VG2 can be connected to a precharge potential through precharge circuit 104. In this manner, selected memory cell 310 can have a source electrically connected to ground through a VG selection transistor TG12 and a drain can be electrically connected to sense amplifier 102 through bank selection transistor TB22 and data selection transistor T31.

In the present embodiment, digit line D3 can also be electrically connected to sense amplifier 102 by way of data selection transistor T32. In this manner, sub-digit line D32 can also be electrically connected to sense amplifier 102 by way of bank selection transistor TB32.

However, because the cell 312 adjacent to memory cell 310 can be an off-cell, current (shown as a dashed line in FIG. 3) flowing from precharge circuit 104 through the row of memory cells connected to word line W01 can be blocked from sub-digit line D22 and memory cell 310. Therefore, in this case, a steady-state current ISA flowing through selected cell 310 is the same as the current flowing through digit line D22 and sensed by sense amplifier 102.

Memory cell transistors, such as 310 and 312, connected to the same word line (W00 to Wn) can be connected in series in the x-direction, which is orthogonal to the y-direction. Two adjacent memory cells can share a sub-digit line (D21 to D52). Connection points between two adjacent memory cells can be conceptualized as chain links. Chain links can be electrically connected to sense amplifiers by way of bank selector circuit and y-selector 103. Chain links can be electrically connected to ground or a precharge circuit 104 by way of virtual ground selection circuit 315.

In the flat cell architecture, cell transistors are connected in series. When a series string of cell transistors are on-bits, a selected cell can be electrically connected to a large capacitive load of these on-bits. Also, digit lines and virtual ground lines associated with unselected memory cells can further add load capacitance than can deteriorate the ability to correctly evaluate the data stored in a selected cell. In order to reduce current flow that would be necessary to charge up the capacitive load in these cases, source drain region of non-selected memory cells have been precharged to a precharge voltage by way of digit lines and main virtual ground lines associated with the unselected cells.

Figure 5:
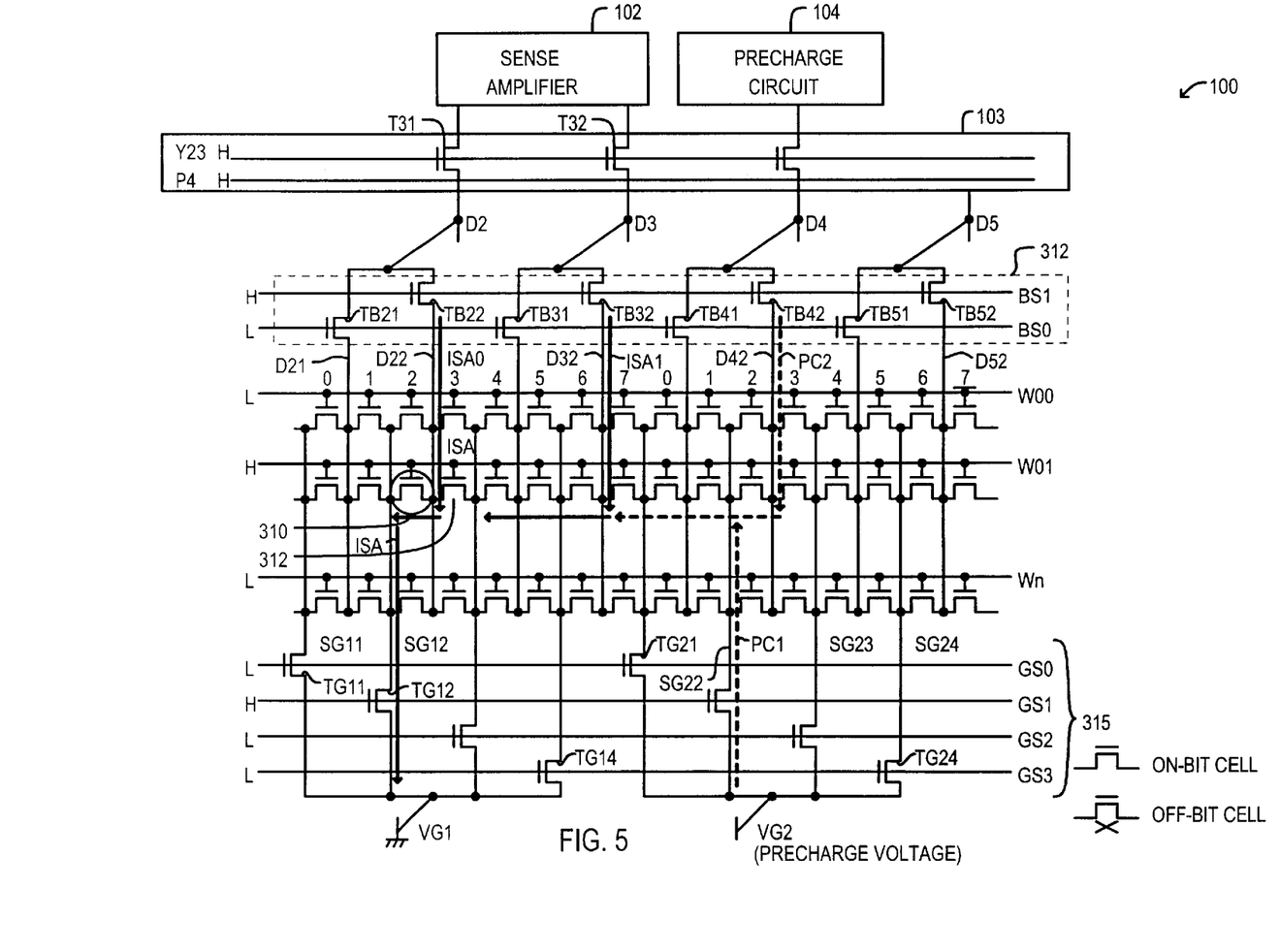
FIG. 5 is a circuit diagram showing an operating state of the semiconductor memory device according to the embodiment of FIG. 1.

Referring now to FIG. 5, a circuit diagram showing an operating state of semiconductor memory device 100 of the present embodiment is set forth. For simplicity, the circuit diagram of FIG. 5, illustrates only a portion of the memory cell array 101 corresponding to digit lines (D2 to D5). The circuit diagram of FIG. 5, illustrates a case in which memory cell 310 can be selected and a string of adjacent memory cells can be on-bit cells.

As noted earlier, when memory cell 310 is selected, word line W01 can become logic high and y-selection signal Y23, precharge signal P4, bank selection signal BS1, and ground selection line GS1 can also become logic high. Also, main virtual ground line VG1 can be connected to ground and main virtual ground line VG2 can be connected to a precharge potential through precharge circuit 104. In this manner, selected memory cell 310 can have a source electrically connected to ground through a VG selection transistor TG12 and a drain can be electrically connected to sense amplifier 102 through bank selection transistor TB22 and data selection transistor T31.

In the illustration in FIG. 5, as with FIG. 3, both digit line D2 associated with selected memory cell 310 and digit line D3 associated with adjacent unselected memory cells can be electrically connected to sense amplifier 102. With this configuration a memory cell 4-bits away from selected memory cell 310 can have a drain region electrically connected to the sense amplifier 102 by way of sub-digit line D32. In this manner, both the current ISA0 flowing through digit line D22 and current ISA1 flowing through sub-digit line D32 can be evaluated by the sense amplifier 104 to determine the data value of selected memory cell 310. It is noted that digit line D2 associated with selected memory cell 310 and digit line D3 associated with adjacent unselected memory cells are not complementary digit lines in that they may not simultaneously carry selected data and complementary selected data.

At the same time, main virtual ground line VG2 can receive precharge voltage from precharge circuit 104. With ground select line GS1 at a logic high, the precharge voltage can be electrically connected to a column of memory cells by way of secondary ground line SG22. If all memory cells between the connection point of secondary ground line SG22 and row of memory cells along selected word line W01 and the selected memory cell 310 are on-bit cells, then a current IPC1 can be created from main virtual ground line VG2 and ground VG1, through the on-bit cells. However, this current must flow through 8 on-bit cells, which can create a relatively high resistive path. Thus, current IPC1 can be relatively small.

At the same time, digit line D4 can receive receive precharge voltage from precharge circuit 104. With precharge signal P4 at a logic high, the precharge voltage can be electrically connected to a column of memory cells by way of secondary ground line sub-digit line D42. If all memory cells between the connection point of sub-digit line D42 and row of memory cells along selected word line W01 and the selected memory cell 310 are on-bit cells, then a current IPC2 can be created from sub-digit line D42 and ground VG1, through the on-bit cells. However, this current must flow through 9 on-bit cells, which can create a relatively high resistive path. Thus, current IPC1 can be relatively small.

The current ISA flowing through selected transistor 310 can be the sum of the current ISA0 flowing through selected digit line D2, the current ISA1 flowing through adjacent digit line D3, the current IPC1 flowing from precharge circuit 104 through secondary virtual ground line SG22, and the current IPC2 flowing from precharge circuit 104 through digit line D4.

$$ISA = (ISA0 + ISA1) + (IPC1 + IPC2)$$

The first term of the equation can be variable due to the effects of precharging. The total sense amplifier current can vary between a maximum sense amplifier current ISA as in the case of FIG. 3, which may not be affected by precharging and a minimum sense amplifier current (ISA0+ISA1) in the case of FIG. 5, which can be affected by precharging.

In this equation, sense amplifier 102 receives both ISA0 and ISA1. Thus, only IPC1 and IPC2 can cause errors as the difference between the received sense current and the current flowing through the selected memory cell 310. However, it has been noted above, that the resistive path from precharge circuit 104 to ground through the string of on-bit cells in which IPC1 and IPC2 must flow will be relatively large. Therefore, IPC1 and IPC2 can be relatively small currents.

ISA1 can be viewed as a first order current, IPC1 and IPC2 can be viewed as second order currents of a much smaller magnitude. Thus, by allowing sense amplifer 102 to receive first order current ISA1, the sensing reliability can be improved.

Figure 6:
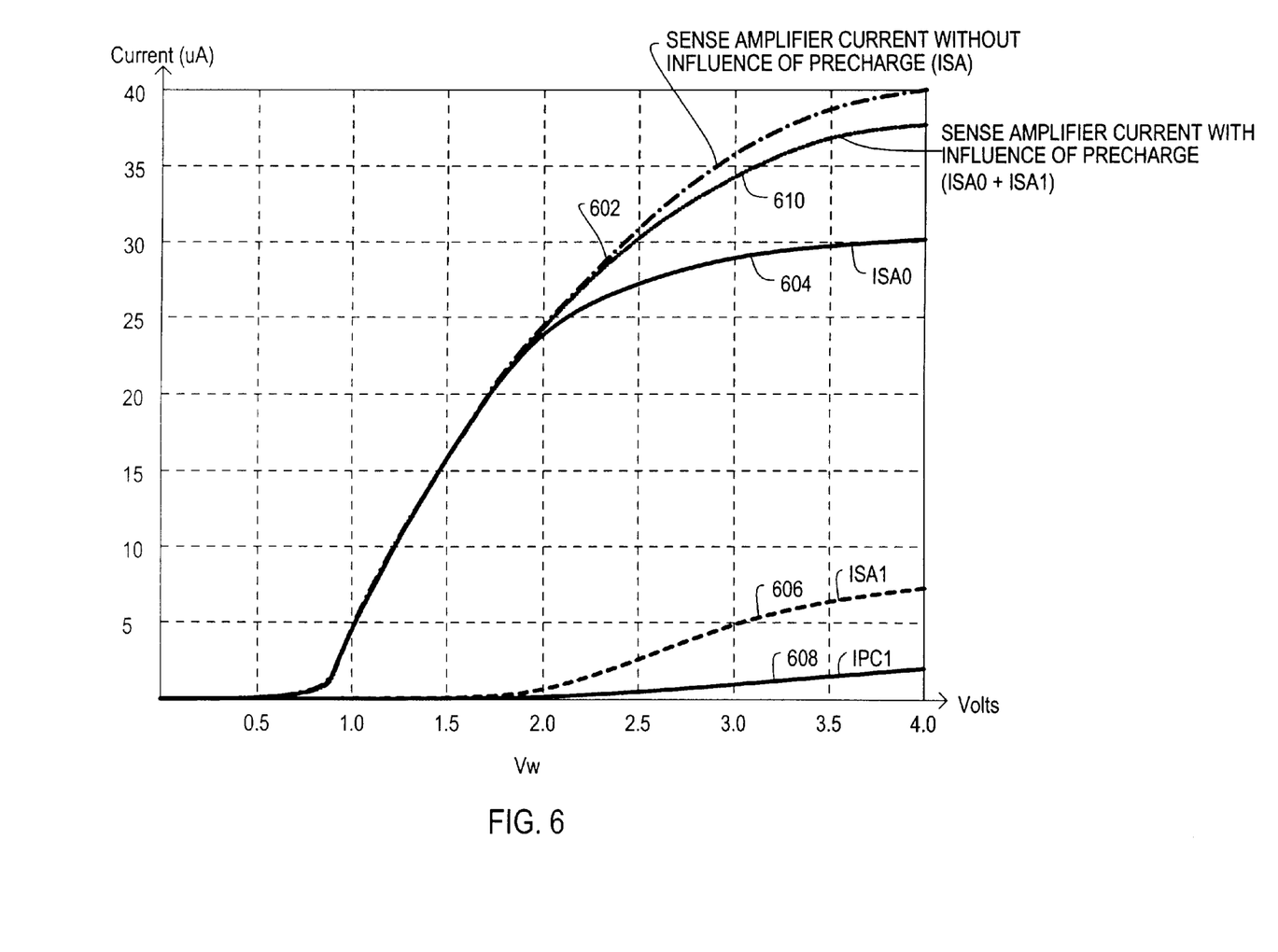
FIG. 6 is a graph illustrating a simulation of currents in the memory cell configurations of FIGS. 3 and 5 over a range of operating voltages.

Referring now to FIG. 6, a graph illustrating a simulation of currents in the memory cell configurations of FIGS. 3 and 5 over a range of operating voltages.

Waveform 602 illustrates the current ISA as shown in FIG. 3 in which the cell adjacent to selected cell 310 can be an off-bit cell. Waveform 604 can illustrate the current ISA0 as shown in FIG. 5 in which the cell adjacent to selected cell 310 is an on-bit cell. Waveform 606 can illustrate the current ISA1 as shown in FIG. 5. Waveform 608 can illustrate the current IPC1 as shown in FIG. 5. Waveform 610 can illustrate the current (ISA0+ISA1) as shown in FIG. 5. It is noted that the waveform 610 can illustrate a minimum sense current and waveform 602 can illustrate a maximum sense current. The difference between the maximum and minimum sense amplifier currents can be controlled to about 2 uA and the maximum sense amplifier current can be approximately 35 uA at an operating voltage of about 3.3 volts.

It is understood that y-selection signals (Y01 to Y70), bank selection signals (BS0, BS1), ground selection signals (GS0 to GS3) can be activated by decoding an address that may be applied externally to the semiconductor memory device (100) during a read command. It can also be understood that a word line (W01) may also be activated by decoding an address that may be applied externally to the semiconductor memory device (100) during a read command.

It is understood that the embodiments described above are exemplary and the present invention should not be limited to those embodiments.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor memory device, comprising:
   a sense amplifier;
   a memory cell array provided with a plurality of memory cell transistors that are chain linked in series and can be programmed to conduct simultaneously when selected;
   a plurality of digit lines coupling a plurality of chain links formed between the plurality of cell transistors to the sense amplifier and coupling the plurality of chain links formed between the plurality of cell transistors to the precharge circuit;
   a plurality of virtual ground lines different than the digit lines coupled to a plurality of chain links formed between the plurality of cell transistors; and
   a first selection circuit coupled between the sense amplifier and the plurality of digit lines, the first selection circuit operates to electrically connect a first and second digit line of the plurality of digit lines to the sense amplifier.

2. The semiconductor memory device of claim 1, further including:
   a precharge circuit wherein the first selection circuit operates to electrically connect a third digit line of the plurality of digit lines to the precharge circuit.

3. The semiconductor memory device of claim 2, wherein the first and second digit lines are adjacent digit lines.

4. The semiconductor memory device of claim 1, further including:
   a reference potential;
   a second selection circuit coupled between the plurality of virtual ground lines and the plurality of memory cells, the second selection circuit operates to electrically connect a first virtual ground line of the plurality of virtual ground lines to at least one chain link; and
   the first virtual ground line receives the reference potential.

5. The semiconductor memory device of claim 4, wherein:
   the second selection circuit operates to electrically connect a second virtual ground line of the plurality of virtual ground lines to at least one chain link; and
   the second virtual ground line receives a precharge potential.

6. The semiconductor device of claim 1, wherein:
   when memory cells chain linked in series and programmed to conduct are selected simultaneously, a first current flows through a first of the digit lines, a second current flows through a second of the digit lines, and a third current flows from a precharge voltage supplied by at least one of the virtual ground lines, the third current being less than the first and second currents.

7. The semiconductor memory device of claim 6, further including:
   a precharge circuit; and
   a fourth current flowing from the precharge circuit through a third of the plurality of digit lines, the first and second currents being greater than the fourth current.

8. A semiconductor memory device, comprising:
   a plurality of word lines arranged in a first direction, each word line being electrically connected to a plurality of memory cells having source/drain paths arranged in series, adjacent memory cells being electrically connected to one another at a common source/drain node;
   a plurality of digit lines coupled to the plurality of memory cells;
   a sense amplifier;
   a first selection circuit that receives a plurality of first selection signals and is coupled between the sense amplifier and the plurality of digit lines, the first selection circuit electrically connecting a first and second digit line from the plurality of digit lines to the sense amplifier during a read operation wherein the first digit line is coupled to a selected memory cell and the sense amplifier detects a data value stored in the selected memory cell during the read operation;
   a bank selection circuit receiving a plurality of bank selection signals and coupled between the first digit line and a first and second sub-digit line; and
   the first sub-digit line being electrically connected to the selected memory cell and the second sub-digit line being electrically connected to a second memory cell that is adjacent to the first memory cell.

9. The semiconductor memory device according to claim 8, further including:
   a first main ground line receiving a reference voltage during the read operation; and
   a second selection circuit receiving a plurality of second selection signals and coupled between the first main ground line and the plurality of memory cells, the selection circuit electrically connecting the first main ground line and the selected memory cell during the read operation.

10. The semiconductor memory device according to claim 9, wherein:
    the first selection circuit couples a third digit line from the plurality of digit lines to a precharge circuit during the read operation and the first and second digit lines are adjacent digit lines.

11. The semiconductor memory device according to claim 9, further including:
    a second main ground line coupled to the second selection circuit and receiving a precharge voltage during the read operation; and
    the second selection circuit electrically connects a common source/drain node of one of the plurality of memory cells other than the selected memory cell and the second main ground line.

12. The semiconductor device according to claim 8, wherein the semiconductor memory device is a read only memory.

13. A method of outputting data in a semiconductor memory device, comprising:
    detecting a data value stored in a selected memory cell by summing a first current flowing through a first digit line and a second current flowing through a second digit line.

14. The method of outputting data according to claim 13, wherein the semiconductor memory device has a plurality of memory cells having source/drain paths arranged in series along a first direction where adjacent memory cells are electrically connected at a common source/drain node.

15. The method of outputting data according to claim 13, further including:

selectively precharging a third digit line to a precharge potential.

16. The method of outputting data according to claim 15, wherein the semiconductor memory device has a plurality of memory cells having source/drain paths arranged in series along a first direction where adjacent memory cells are electrically connected at a common source/drain node, the method further including:

selectively applying substantially the precharge potential to a common source/drain node connected to a memory cell other than the selected memory cell.

17. The method of outputting data according to claim 13, further including:

selectively applying a reference potential to a source of the selected memory cell; and the first and second digit lines are not complementary.

18. The method of outputting data according to claim 13, further including:

activating a selection signal to electrically connect the first and second digit lines to a sense amplifier; and activating a bank selection signal to couple the first digit line to a sub-digit line, the sub-digit line being electrically connected to the selected memory cell.

* * * * *